United States Patent [19]
Farrand et al.

[11] 3,961,318
[45] June 1, 1976

[54] ELECTROSTATIC POSITION-MEASURING TRANSDUCER

[75] Inventors: Robert W. Farrand, Weston, Conn.; Joseph Elbling, Armonk, N.Y.

[73] Assignee: Inductosyn Corporation, Valhalla, N.Y.

[22] Filed: Jan. 17, 1975

[21] Appl. No.: 541,983

[52] U.S. Cl. ............................ 340/200; 317/253; 324/61 R; 323/93; 318/662
[51] Int. Cl.² ........................................ G08C 19/16
[58] Field of Search ............. 340/200, 271; 323/93; 317/253, 250, 254; 324/72, 61 R; 318/662

[56] References Cited
UNITED STATES PATENTS

| | | | |
|---|---|---|---|
| 2,799,835 | 7/1957 | Tripp et al. | 336/129 |
| 3,146,394 | 8/1964 | Frisch | 340/200 |
| 3,222,668 | 12/1965 | Lippel | 340/200 |
| 3,238,523 | 3/1966 | Masel et al. | 340/200 |
| 3,702,467 | 11/1972 | Melnyk | 340/200 |
| 3,873,916 | 3/1975 | Sterki | 324/61 R |

*Primary Examiner*—John W. Caldwell
*Assistant Examiner*—James J. Groody
*Attorney, Agent, or Firm*—John L. Downing

[57] ABSTRACT

Two relatively movable, spaced elements having electrostatically coupled sets of uniformly spaced interdigitated electrodes form a precision, high gain linear or angular position-measuring transducer. Coupling electrodes on one element capacitively couple to portions of the electrodes on the other element so that electrical connections to external excitation and detection circuitry need be made to only one of the two elements. The shape and dimensions of the electrodes can be arranged to reduce or eliminate undesired impedance variations, capacitive coupling and unwanted harmonic coupling wave frequency components.

17 Claims, 11 Drawing Figures

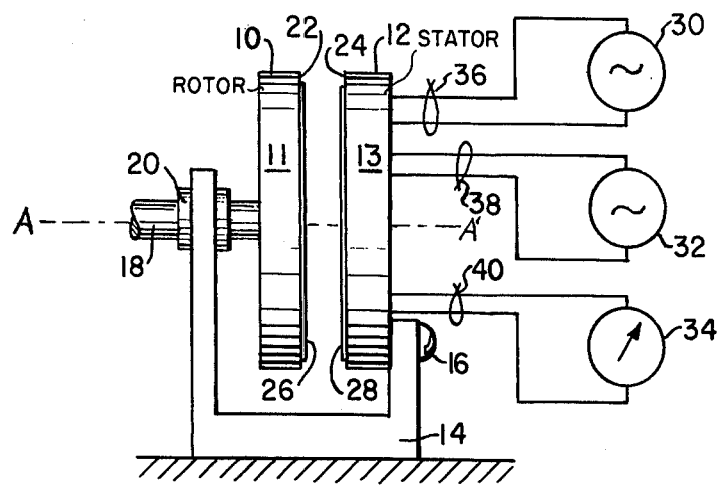
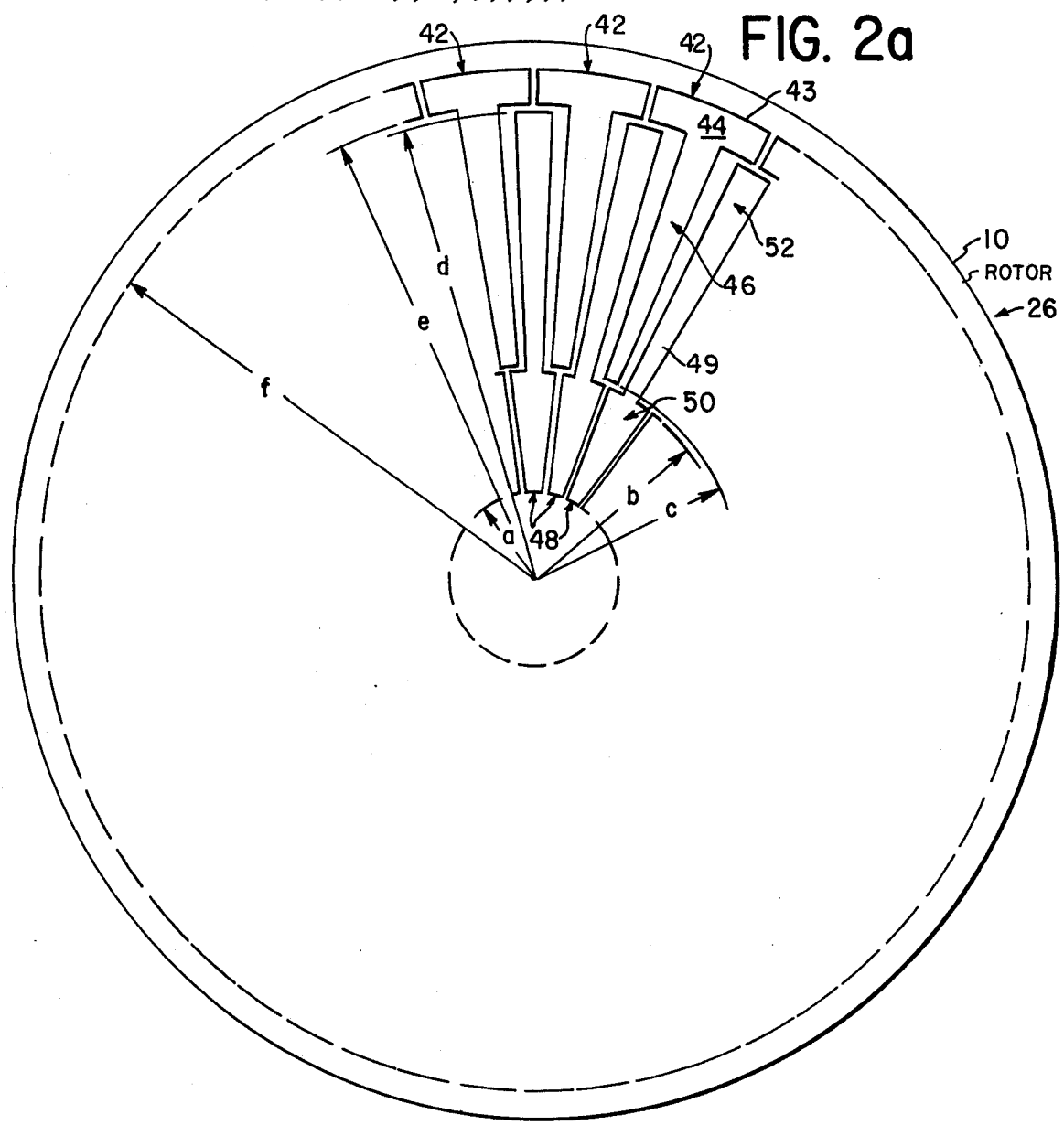

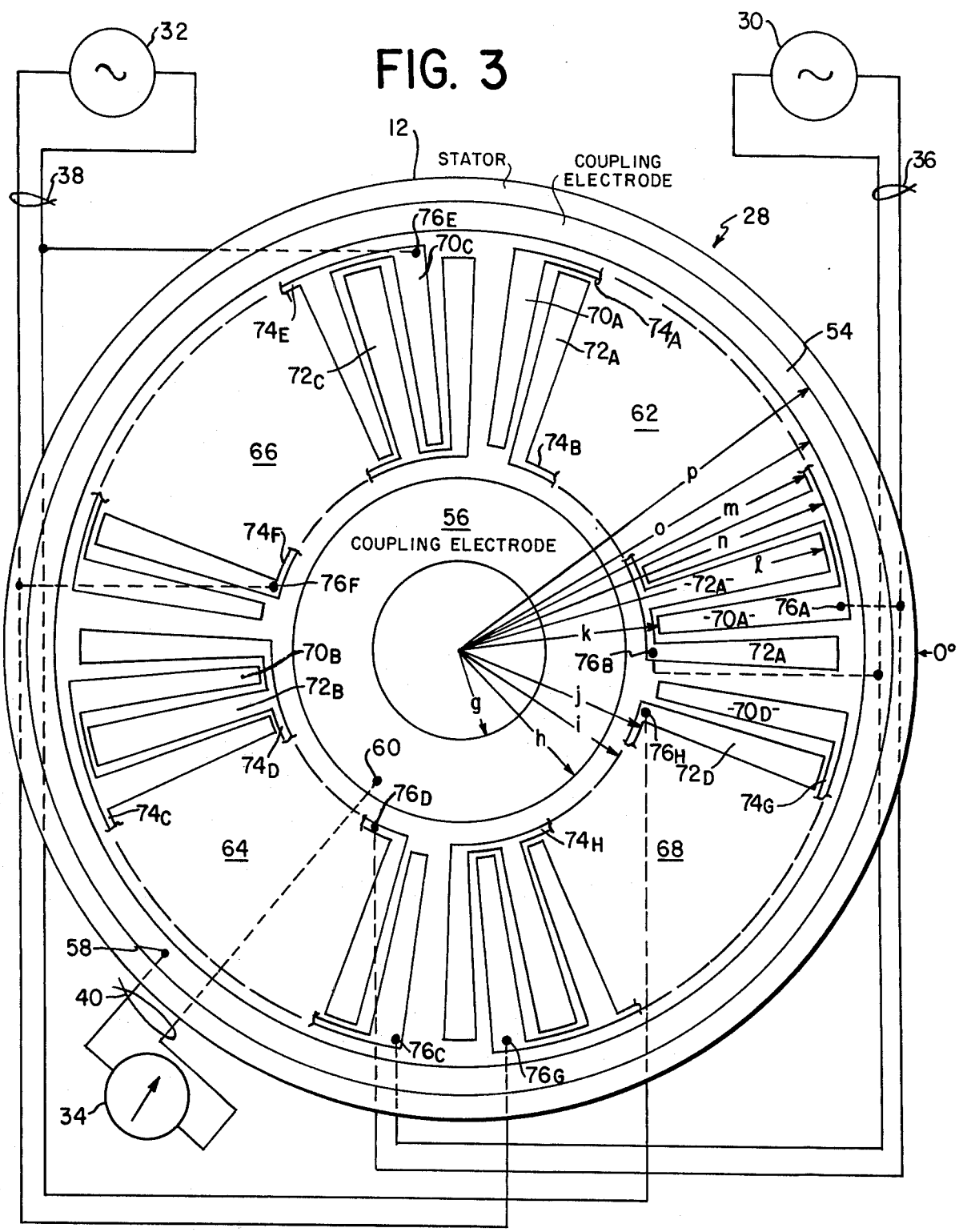

ELECTROSTATIC POSITION-MEASURING TRANSDUCER

BACKGROUND OF THE INVENTION

1. Field of the Invention

This invention relates to position measuring transducers and more particularly to a position measuring transducer having two relatively movable members bearing electrostatically coupled electrodes.

2. Description of the Prior Art

Precision position measuring transducers of the resolver type using the effect of magnetic coupling between multipole transformer windings on relatively movable members are well known in the art. In order to increase the precision of this type of transducer, however, it is necessary to reduce the spacing between transformer turns, thereby reducing the cross-sectional area of the current carrying windings (which are typically in the form of thin printed copper layers). As this area is reduced, the $I^2R$ loss in the windings is increased, and the effective gain of the transducer is drastically cut, effectively setting a limit on practicably attainable precision of this type of transducer.

In order to overcome this disadvantage, the present disclosure teaches a novel, high gain position measuring transducer which does not employ magnetic inductive coupling effects, but instead uses electrostatic effects between electrodes arrayed on relatively movable members. Since these electrodes are not required to carry appreciable currents, their dimensions can be miniaturized and transducer precision increased without an accompanying serious decrease in transducer gain.

In addition to the increased precision inherent in the miniaturization of the electrode dimensions, such miniaturization permits the use of ultra-thin electrodes which can be produced by photoetching techniques with much greater positional accuracy than can thicker electrodes. Ultra-thin electrodes of very narrow width also have greater mechanical adherence and stability than thicker electrodes of the same width because they are less subject to undercutting by the etching process which tends to reduce the area of the interface between the electrodes and the surface on which they are deposited.

Position measuring devices using electrostatic effects to generate electrical signals in reponse to angular or linear displacement of two relatively movable members have previously been proposed. One such device, disclosed in U.S. Pat. No. 2,674,729 to Carter, has two relatively rotatable disks separated by a narrow air gap, each disk bearing a large number of opposed interleaved finger-like electrodes. Excitation of the electrodes on one disk induces a voltage across the opposing electrodes on the other disk, and this voltage varies as one disk is rotated with respect to the other, giving an indication of their relative angular displacement.

Another electrostatic position measuring device, shown in U.S. Pat. No. 3,125,716 to Machlis, comprises a phase shifting apparatus which employs two sets of conjugate sinusoidal conductive patterns mounted on a stator element together with two output conductors. Relatively movable coupling elements are arrayed on a rotor element in spaced opposition to the sinusoidal patterns, which are excited by an alternating voltage source. An output voltage is electrostatically induced in the output conductors, the phase of the output voltage varying as a function of the relative angular displacement of the rotor and stator elements.

However, serious difficulties have been encountered with these electrostatic devices of the prior art. For example, spurious electrostatic coupling between input and output electrodes has required the use of specialized shielding circuitry such as that described in U.S. Pat. No. 3,219,920 to wall. Undesired harmonics are present in the output signal of electrostatic devices of the prior art. This impairs the accuracy of such devices when employed for position measuring purposes. Additionally, when the angular or linear extent of electrodes on one element is changed relative to the extent of electrodes on the opposing element, the impedance relationship between the elements is altered, necessitating the adjustment of related external circuitry to optimize the device's performance.

SUMMARY OF THE INVENTION

The present invention provides a high gain position measuring transducer having a plurality of uniform angular or linear measurement cycles. The invention comprises two relatively movable elements each of which has a surface in spaced opposition to a surface on the other element. Two sets of first electrodes are arrayed on the surface of one of the elements, and a plurality of sets of second electrodes and two coupling electrodes are fixed on the opposed surface of the other element. Each first electrode has a base portion and a finger portion extending from said base portion in a direction transverse to the path of relative movement of the two elements. The finger portions of each set of first electrodes are uniformly spaced one measurement cycle apart, and the fingers of one set of first electrodes are interdigitated at one-half cycle spacing with the finger portions of the other set of first electrodes. The base portions of the electrodes in each set can be connected to form a continuous area, or alternatively they can be isolated one from another to achieve certain advantages as described hereinafter.

The second electrodes on the other element comprise at least two sets of interleaved finger portions extending in a direction transverse to the path of relative movement of the two elements, spaced one measurement cycle apart and opposing the finger portions of the first electrodes. Two coupling electrodes are also fixed on the surface of the same element in spaced opposition to and capacitively coupling with the base portions of the first electrodes on the other element.

Means are provided for interconnecting each set of second electrodes and for connecting those second electrode sets in an external circuit. Means are also provided for connecting the coupling electrodes in an external circuit. No external connection is made to the first electrodes. Additional features for eliminating unwanted electrostatic coupling and for reducing undesired harmonics in the operation of the device are also provided as will be described hereinafter.

Although for convenience of language the terms "first" and "second" are used herein to identify the opposed sets of electrodes, it is to be understood that those terms are not be be interpreted as defining a particular manner in which the electrodes are energized or in which they electrostatically interact.

Thus, in the present invention, an external voltage can be applied to the second electrodes to induce a voltage in the first electrodes, and this voltage will be capacitively coupled to the coupling electrodes where an output signal can be detected. The output signal will vary as a function of the relative displacement of the two transducer elements. Alternatively, an external voltage can be applied to the coupling electrodes, inducing a voltage in the first electrodes which capacitively couple with the second electrodes from which an output signal can be detected.

BRIEF DESCRIPTION OF THE DRAWING

FIG. 1 is a side elevational view of a rotary embodiment of the present invention and related circuitry.

FIG. 2a is a front elevational view of the rotor element of the embodiment of FIG. 1 showing one rotor electrode pattern suitable for use with that rotary embodiment.

FIG. 3 is a front elevational view of the stator element of the embodiment of FIG. 1 showing stator and coupling electrode pattern suitable for use with that rotary embodiment, together with related circuitry.

DESCRIPTION OF SPECIFIC EMBODIMENTS

Rotary Embodiment

Figure 2B:
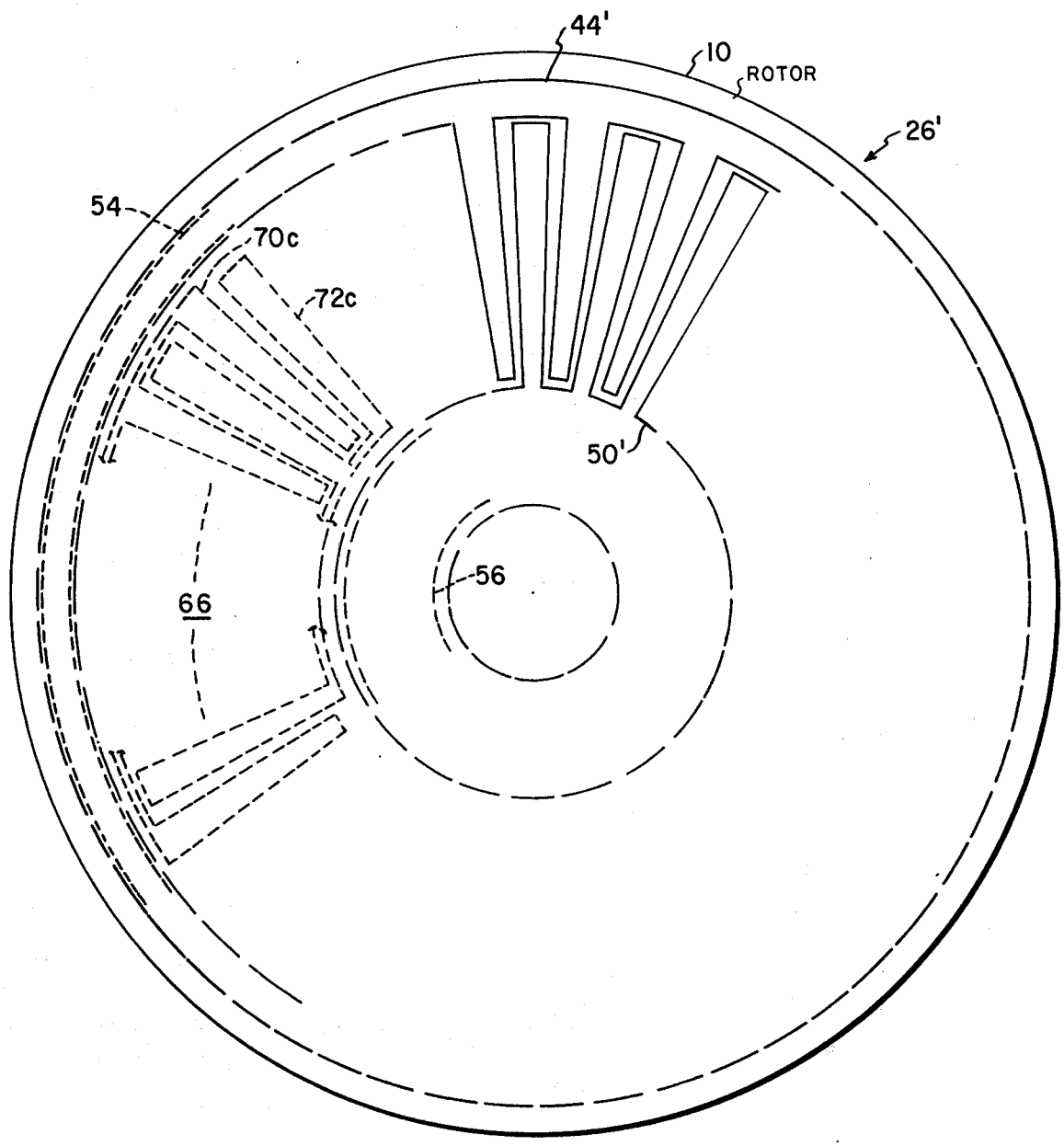
FIG. 2b is a front elevational view of the rotor element of the embodiment of FIG. 1 showing an alternative rotor electrode pattern suitable for use with that rotary embodiment.

FIG. 1 shows a rotary embodiment of the present invention in which a circular rotor element 10 and a circular stator element 12 are positioned for relative movement about a common axis of rotation A-A'. The stator element 10 is fastened to a rigid mounting member 14 by means of a bolt 16. The rotor element 10 has an attached concentric shaft 18 which passes through a bearing 20 fitted in the mounting member 14. The shaft 18 may be connected to an external rotary drive (not shown) whose angular displacement is to be measured. The rotor and stator elements 10 and 12 have rigid insulating bases 11 and 13, respectively, of Fiberglas or similar material, and have opposed surfaces 22, 24 separated by a narrow air gap in the range of 0.001 in. (0.0254 mm.) to 0.015 in. (.509 mm.).

A pattern 26 of 0.0005 in. (0.0127 mm.) thick copper electrodes is produced by photoetching or like means on the surface 22 of the rotor element 10, and another pattern 28 of similarly produced electrodes is arrayed on the surface 24 of the stator element 12.

As will be described hereinafter, a sine signal generator 30, a cosine signal generator 32, and a detector 34 can be connected by their respective signal lines 36, 38, and 40 passing through holes in the stator element 12, to make electrical contact with terminal points on the electrodes on the stator surface 24. These connections are shown schematically in FIG. 1 and in more detail in FIG. 3. No electrical connections are made to the electrodes 26 on the surface 22 of the rotor element.

One pattern 26 of rotor (or first) electrodes suitable for use in the invention is shown in FIG. 2a. A first set 42 of isolated rotor electrodes is arrayed around the circumference of the rotor 10, each electrode in the set (as exemplified by the electrode 43) having a base portion 44 and a finger portion 46 extending from the base portion 44 radially toward the rotor center. In the illustrated rotary embodiment, each of the finger portions has a uniform angular spacing of 14.4°, and this spacing defines one measurement cycle of the device. A total of 25 electrodes 42 encircle the rotor center. The angular width of each finger portion is 4.8°, and the base portions (each corresponding to portion 44 of electrode 43) are separated one from another by 0.005 in. (0.127 mm.). A second set 48 of 25 rotor electrodes is interdigitated with the first set 42 of rotor electrodes. The electrodes in set 48 also have isolated base portions (as exemplified by base porton 50 of electrode 49) and finger portions (as indicated by the finger portion 52) extending from the base portions radially away from the rotor center. The finger portions of electrode set 48 are also uniformly spaced at 14.4° angles around the rotor, and each has an angular width of 4.8°. The dimensions of the base portions of electrode sets 42 and 48 are such that the combined areas of the base portions of the first set 42 of rotor electrodes equals the combined areas of the base portions of the second set of rotor electrodes. The pattern dimensions indicated in FIG. 2a for the illustrated embodiment are given in TABLE I.

TABLE I

| Dimension | Length |
|---|---|
| a | .125 in. (3.18 mm.) |
| b | .293 in. (7.44 mm.) |
| c | .303 in. (7.70 mm.) |
| d | .665 in. (16.89 mm.) |
| e | .675 in. (17.14 mm.) |
| f | .725 in. (18.41 mm.) |

An alternative pattern 26' of rotor electrodes suitable for use with the invention is shown in FIG. 2b. The pattern 26' is identical in all respects to the previously described pattern 26 with the exception that the base portions of the outer and inner sets of electrodes are respectively connected to form continuous annular areas 44' and 50'.

FIG. 3 shows a pattern 28 of electrodes arrayed on the surface 24 (see FIG. 1) of the stator element 12 of the illustrated rotary embodiment. A first coupling electrode 54 is arrayed as a ring around the circumference of the stator 12 so as to be in spaced opposition to the base portions of the first set 42 of rotor electrodes when the rotor 10 and stator 12 are mounted as shown in FIG. 1. The width of the first coupling electrode 54 is less than the radial width of the opposed base portions of electrodes 42. A second coupling electrode 56 forms an inner ring positioned to be in spaced opposition to the base portions of the second set 48 of rotor electrodes and to have a width less than the radial width of those base portions. The opposed relationship of the coupling electrodes 26' is depicted in FIG. 2*b* where positions of the coupling electrodes 54 and 56 are drawn in broken lines. The widths of the coupling electrodes 54 and 56 are chosen so that the areas of the two coupling electrodes are equal. Each coupling electrode 54, 56 has a respective terminal point 58, 60 at which the electrode can be connected to an external circuit as will be described hereinafter.

The remaining electrodes on the stator surface 24 of the rotary embodiment are stator (or second) electrodes divided into two phases, arrayed in space quadrature, each phase being further divided into two phase sectors. The first phase of stator electrodes comprises sectors 62 and 64, diametrically opposed and positioned between the coupling electrodes 54, 56 to be in spaced opposition to the finger portions 46, 52 of the rotor electrodes. The second phase of sector electrodes is composed of diametrically opposed sectors 66 and 68 positioned between the first phase sectors 62, 64 and arranged to be in space quadrature relative to the first phase of stator electrodes, i.e. uniformly spaced one-quarter of a measurement cycle out of phase with the spacing of the first phase electrodes. The opposed relationship of the stator electrodes to the rotor electrode pattern 26' is represented in FIG. 2*b* where stator electrode sector 66 is shown in broken lines. Each sector of stator electrodes has a first group of radially extending fingers $70_{A-D}$ centrally interdigitated with a second group of radially extending fingers $72_{A-D}$. The fingers in each group are uniformly spaced at 14.4° intervals, have a radial width of 4.8°, and are electrically interconnected by conductive strips $74_{A-H}$. TABLE II lists the angular position for the center line of each of the 48 stator electrodes beginning at the 0° position indicated in FIG. 3 and going counter clockwise around the stator center.

TABLE II

| Stator Electrode | Center Line | Stator Electrode | Center Line |
|---|---|---|---|
| 1st phase sector (62) | 0° | 1st phase sector (64) | 180.0° |
| | 7.2 | | 187.2 |
| | 14.4 | | 194.4 |
| | 21.6 | | 201.6 |
| | 28.8 | | 208.8 |
| | 36.0 | | 216.6 |
| | 43.2 | | 232.2 |
| | 50.4 | | 230.4 |
| | 57.6 | | 237.6 |
| | 64.8 | | 244.8 |
| | 72.0 | | 252.0 |
| | 79.2 | | 259.2 |
| 2nd phase sector (66) | 90.0 | 2nd phase sector (68) | 270.0 |
| | 97.2 | | 277.2 |
| | 104.4 | | 284.4 |
| | 111.6 | | 291.6 |
| | 118.8 | | 298.8 |
| | 126.0 | | 306.0 |
| | 133.2 | | 313.2 |
| | 140.4 | | 320.4 |
| | 147.6 | | 327.6 |
| | 154.8 | | 334.8 |
| | 162.0 | | 342.0 |
| | 169.2 | | 349.2 |

Terminal means $76_{A-H}$ are provided so that the stator electrodes can be connected to external circuitry by means of wires passing through the body of the stator 12 to the terminals $76_{A-H}$ where they are soldered or otherwise electrically connected. The radial distance spanned by the fingers $70_{A-D}$, $72_{A-D}$ in each sector is less than the radial distance spanned by the opposed rotor electrode finger portions 46, 52. The actual stator pattern dimensions for the illustrated rotary embodiment are given in TABLE III.

TABLE III

| Dimension | Length |
|---|---|
| g | .140 in. (3.55 mm.) |
| h | .275 in. (6.98 mm.) |
| i | .313 in. (7.95 mm.) |
| j | .325 in. (8.25 mm.) |
| k | .335 in. (8.51 mm.) |
| l | .638 in. (16.20 mm.) |
| m | .649 in. (16.48 mm.) |
| n | .655 in. (16.64 mm.) |
| o | .680 in. (17.27 mm.) |
| p | .720 in. (18.29 mm.) |

FIG. 3 also shows one suitable arrangement for connecting the stator and coupling electrodes to external circuitry for the measurement of relative angular position of the stator and rotor elements 10, 12 of the device. Sine generator 30 is a source of alternating electrical energy (typically at a 50 KHz. frequency with a 60 volt rms maximum amplitude.) The amplitude of the output of sine generator 30 is adjusted to be proportional to the sine of a "command angle", $\theta$, and the sine generator 30 is connected to the first phase stator electrodes in the manner illustrated — one output is connected at terminal 76A to the outer group of electrodes $70_A$ of sector 62 and at terminal $76_D$ to the inner group of the diametrically opposed electrodes $72_B$ of sector 64; the other output of generator 30 is connected at terminal $76_B$ to the inner group of electrodes $72_A$ of sector 62 and at terminal $76_C$ to the outer group of electrodes $70_B$ of sector 64. A cosine generator 32 identical to generator 30 is adjusted to have an output voltage proportional to the cosine of the command angle $\theta$, and its outputs are connected as shown — one output is connected at terminal $76_F$ to the inner electrodes $72_C$ of sector 66 and to the outer electrodes $70_D$ of sector 68; the other output is connected at terminal $76_E$ to the outer electrodes $70_C$ of sector 66 and at terminal $76_H$ the inner electrodes $72_D$ of sector 68. A detector 34, and AC voltmeter, is connected at terminals 58 and 60 across the coupling electrodes 54 and 56.

As described and illustrated, the rotary embodiment of FIGS. 1, 2*a* and 3 comprises a 50 pole, 25 cycle position measurement transducer, each measurement cycle representing 14.4° of angular displacement between the rotor and stator elements. Each measurement cycle, in turn, can be considered to comprise a 360° command angle. In the operation of the transducer, when the signal amplitudes of generators 30 and 32 are adjusted to be proportional to the sine and cosine, respectively, of a given command angle $\theta$, those voltages supplied to the stator electrodes $70_{A-D}$, $72_{A-D}$ electrostatically induce a voltage across the opposed rotor electrodes 42, 48, and that induced voltage is capacitively coupled back from the rotor electrode base portions 44, 50 to the coupling electrodes 54, 56 on the stator element 12. The voltage detected by the voltmeter 34 across the coupling electrodes 54, 56 is an "error signal" whose amplitude is a function of the difference between the command angle $\theta$ and the actual angular displacement between the rotor and stator elements within a measurement cycle. This voltage goes to zero when the actual angular displacement between the rotor and stator elements within a measurement cycle equals the command angle $\theta$.

Although the sine generator 30 and the cosine generator 32 are shown as separate electrical units it will be understood by those skilled in the art that the two generators can be combined in a single electromagnetic resolver which has an energized fixed primary transformer winding and two movable secondary windings on a shaft. The secondary windings have axes 90° apart and generate, respectively, voltages proportional to the sine and cosine of the angle of the shaft relative to the fixed primary winding. Other more sophisticated sine and cosine generator apparatus can also be used, such as that described in Tripp U.S. Pat. Nos. 3,686,487 and 3,745,560.

Thus, it is possible to position the rotor 10 accurately relative to the stator 12 by setting the sine and cosine voltages corresponding to the desired command angle $\theta$ and moving the rotor 10 relative to the stator 12 until the detector voltmeter 34 senses a null voltage.

It will be obvious to those skilled in the art that external circuitry can be connected to the described measuring device in other ways. For example, a constant amplitude signal generator can be connected across the coupling electrodes 54, 56, and two voltmeters can be connected across the stator electrodes at terminals $76_{A-H}$. The voltages indicated by the voltmeters will be respectively proportional to the sine and cosine of the actual relative angular displacement of the rotor and stator elements within a measurement cycle. Alternatively, the signal generators 30 and 32 connected to the stator electrodes as shown in FIG. 3 can have equal and constant amplitudes 90° out of time phase with respect to each other, and the resulting signal appearing across the coupling electrodes 54, 56 will be of constant amplitude but will have a time phase shift relative to one of the generators proportional to the relative angular displacement between the rotor and stator elements 10, 12 within a measurement cycle. As is well known, this phase shift can be determined by means of a phase detector connected across the coupling electrodes 54, 56.

As noted above, either of the rotor electrode patterns depicted in FIGS. 2a or 2b can be used with the illustrated rotary embodiment. The pattern of FIG. 2(a), wherein each of the rotor electrodes (or "first electrodes") is physically isolated from the others, has the advantage that the stator electrodes always "see" a constant impedance between themselves and the opposed rotor electrodes, regardless of the relative angular extent of the stator and rotor electrode patterns. Although this feature may not be critical in the specific rotary embodiment herein described in which the rotor electrodes of either pattern occupy a full 360°, other rotary embodiments can be envisioned wherein the rotor or stator electrodes extend through less than 360° and wherein the addition of incremental sectors of rotor electrodes with continuous base portions as shown in FIG. 2b would significantly alter the device impedance and require adjustment of external circuit parameters. The isolated first electrode feature plays a more significant role in connection with linear embodiments of the invention, two of which are described below.

The reduction of undesired harmonic components in the electrostatic coupling waves between the rotor and stator electrodes is accomplished in this invention by dimensioning the widths of the rotor and stator electrodes relative to their spacing in a manner analogous to that disclosed with respect to electromagnetically coupled position measuring devices in Tripp et al. U.S. Pat. No. 2,799,835. In accordance with this feature of the invention any given harmonic of the fundamental space cycle in the electrostatic coupling wave between the rotor and stator electrodes can be reduced by dimensioning the width of the electrode fingers transverse to the path of relative motion between the rotor and stator so that the width of each electrode equals the measurement cycle of the device divided by N, where N is the order of the undesired harmonic.

In the illustrated rotary embodiment, the third harmonic of the fundamental is reduced since the angular width of the electrode fingers is 4.8°, one-third of the 14.4° measurement cycle. Dimensioning the width/cycle ratio for either rotor or stator electrodes can be effective for the suppression of an undesired harmonic, and different ratios can be applied to the rotor and stator electrodes for the reduction of two different harmonic components in the electrostatic coupling wave between electrodes.

Undesired harmonic components can also be reduced in the electrostatic coupling wave between the rotor and stator electrodes by means analogous to another technique taught in the previously mentioned Tripp et al. U.S. Pat. No. 2,799,835 in connection with magnetic inductive position measuring devices. By this technique a harmonic component of order N in the coupling wave will be reduced if the angular extent of each group of secondary (stator) electrodes is either compressed or expanded by an angle equal to the measurement cycle divided by N. For example, in the illustrated rotary embodiment each of the stator electrode sectors 62, 64, 66 and 68 has an angular extent of 86.4° (6 × 14.4°). Therefore, in order to suppress a fifth harmonic component in the coupling wave the angular extent of each of the sectors can be either uniformly expanded or uniformly compressed by one-fifth of the 14.4° measurement cycle (i.e., 2.9°) to occupy an 89.3° or 83.5° angle, respectively.

Another feature of the invention as exemplified in the described rotary embodiment is the reduction of undesired capacitive coupling between the stator electrodes and the coupling electrodes. As shown in FIG. 3, each of the two phases of stator electrodes is divided into two separate electrode sectors, i.e. the first phase stator electrodes are divided into sectors 62 and 64, and the second phase stator electrodes comprise sectors 66 and 68. The first and second phase sectors 62, 66, 64, 68 alternate with each other along the path of relative motion between the rotor 10 and stator 12 so that when the stator electrodes are connected in an external circuit as shown, the voltages applied to the stator electrodes which tend to interact capacitively with the coupling electrodes 54 and 56 balance out, and unwanted capacitive coupling is effectively cancelled. In the circuitry of FIG. 3 if the output of sine signal generator 30 which is connected at terminal $76_A$ to the *outer* group of first phase stator electrodes $70_A$ in sector 62 is considered to be instantaneously at maximum positive voltage, it will be seen that the same output is connected at terminal $76_D$ to the *inner* group of stator electrodes $72_B$ in sector 64. Correspondingly, the other output of sine signal generator 30 will be instantaneously at maximum negative voltage, and this output is connected at terminal $76_B$ to the inner group of first phase stator electrodes $72_A$ in sector 62 and at terminal $76_C$ to the outer group of electrodes $70_B$ in sector 64. In this manner, the effects of voltages applied to the first phase stator electrodes $70_{A-B}$, $72_{A-B}$ by the generator 30 upon the inner and outer coupling electrodes 54 and 56 is exactly balanced out, and capacitive cross-talk between these stator electrodes $70_{A-B}$, $72_{A-B}$ and the coupling electrodes 54, 56 is reduced. The second phase stator electrode sectors 66 and 68 are similarly arranged and connected at terminals $76_{E-H}$ to the cosine signal generator 32 so that capacitive coupling between those electrodes $70_{C-D}$, $72_{C-D}$ and the coupling electrodes 54, 56 is balanced and effectively cancelled out. It will be apparent that the alternation of the stator phase sectors 62, 66, 64, 68 along the path of relative movement in this manner minimizes unwanted coupling regardless of whether the stator electrodes $70_{A-D}$, $72_{A-D}$ are electrically excited directly by generators and a signal is detected across the coupling electrodes 54, 56 or whether the coupling electrodes 54, 56 are directly energized and signals are detected at the stator electrodes $70_{A-D}$, $72_{A-D}$.

The overall capacitive balance of the transducer is also enhanced by having the respective combined areas of the base portions 44 and 50 of the rotor electrodes 42, 48 equal, and also having the areas of the opposed coupling electrodes 54 and 56 equal to each other. As can be noted by examination of FIG. 2b and the dimensions given in TABLES I and III, the radial extent of each coupling electrode 54, 56 is less than the radial extent of the opposed rotor electrode base portion 44, 50 and centrally aligned with those base portions 44, 50 so that the coupling electrodes do not electrostatically interact to any substantial degree with the finger portions 46, 52 of the rotor electrodes 42, 48. Similarly, the radial extent spanned by the stator electrode fingers $70_{A-D}$, $72_{A-D}$ is less than the radial extent spanned by the opposed rotor electrode finger portions, 46, 52 and centrally aligned with the rotor fingers 46, 52 and the individual stator electrodes $70_{A-D}$, $72_{A-D}$ therefore do not couple to any significant degree with the rotor electrode base portions 44, 50. This dimensioning of the coupling and stator electrodes relative to the rotor electrodes also provides a tolerance factor should the rotor and stator elements not be mounted in a precisely concentric fashion.

First Linear Embodiment

Figure 4:
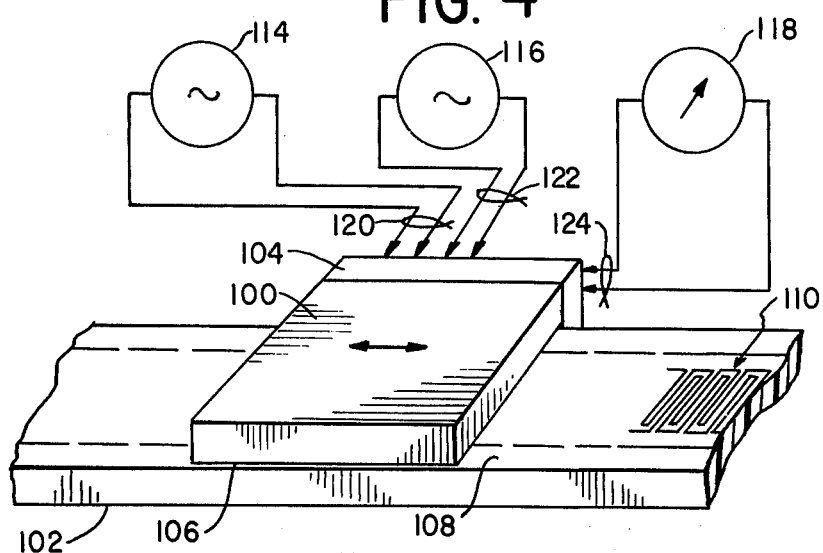
FIG. 4 is a perspective view of a first linear embodiment of the present invention and related circuitry.
Figure 5A:
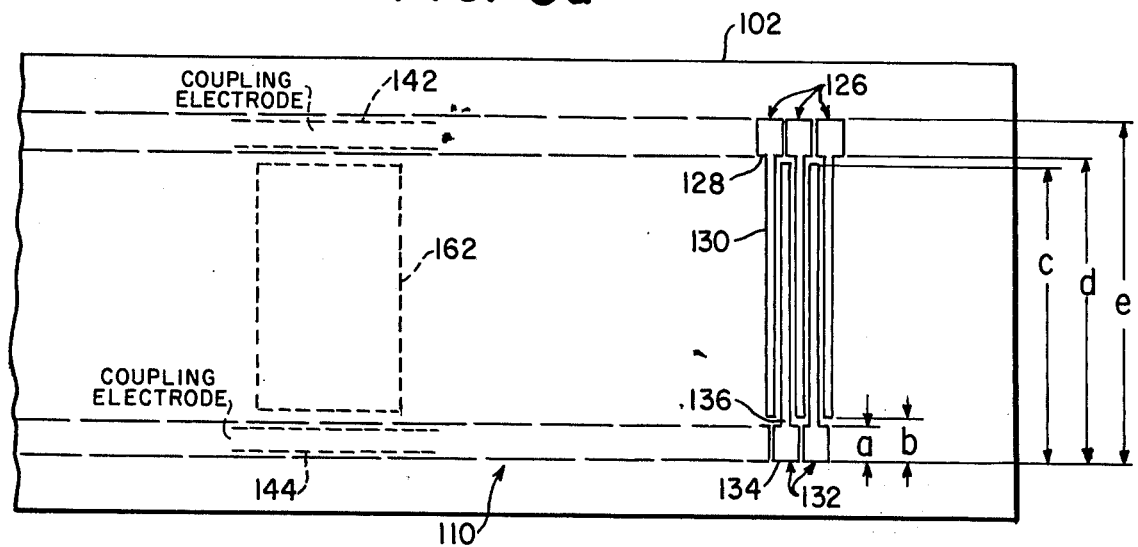
FIG. 5a is a front elevational view of the scale element of the embodiment of FIG. 4 showing one pattern of scale electrodes suitable for use with that first linear embodiment.
Figure 5B:
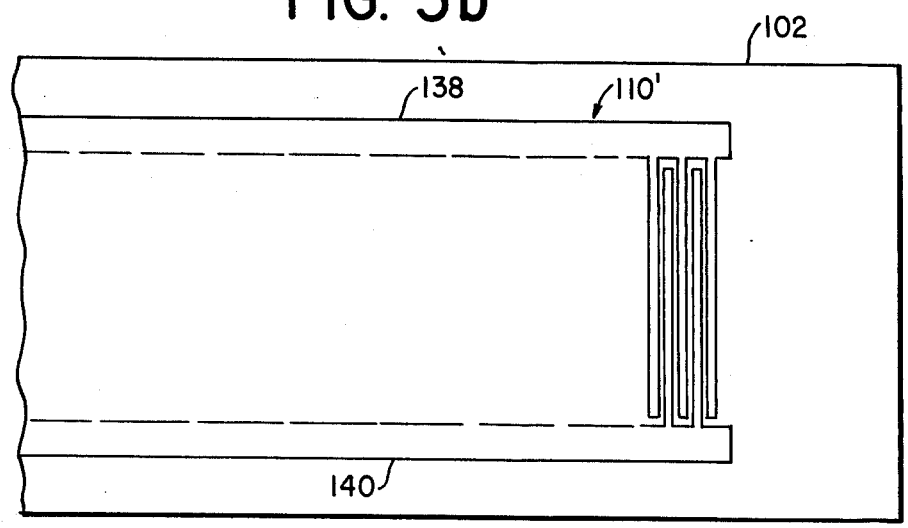
FIG. 5b is a front elevational view of the scale element of the embodiment of FIG. 4 showing another pattern of scale electrodes suitable for use with that first linear embodiment.
Figure 6:
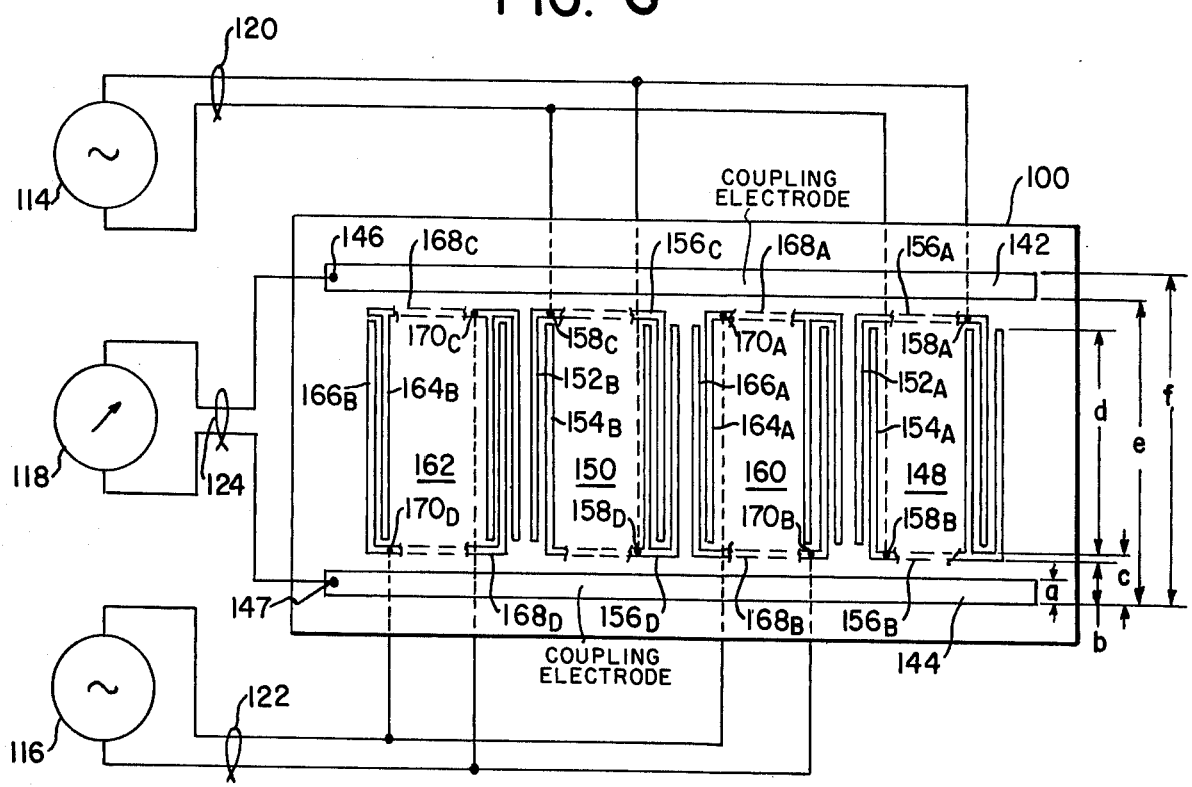
FIG. 6 is a front elevational view of the slider element of the embodiment of FIG. 4 showing a pattern of slider and coupling electrodes suitable for use with that first linear embodiment, together with related circuitry.

A first linear embodiment of the present invention having a 0.01 inch (0.254 mm.) measurement cycle is shown in FIGS. 4–6. FIG. 4 depicts a linear transducer in which a movable slider element 100 is positioned in a spaced relationship to a fixed scale element 102. The slider element 100 is mounted to a fixture 104 which in turn can be attached to a machine part or other mechanically movable member (not shown) whose linear displacement relative to the fixed scale element 102 is to be determined. The motion of the machine part or movable member, and hence the slider element 100, is parallel to the longitudinal axis of the scale element 102. The scale and slider elements 100 and 102 can be formed of aluminum or other rigid material, and they have respective opposed surfaces 106 and 108 separated by a narrow air gap, typically 0.003 in. (0.076 mm.) wide.

Patterns of copper electrodes of 0.0005 in. (0.0127 mm.) thickness are arrayed on the opposed spaced surfaces 106, 108. If the scale and slider elements 100, 102 are metal, the copper electrodes are separated from the surfaces 106, 108 by a thin insulating and adhesive layer. A scale electrode pattern 110 (shown in FIG. 5a) is formed on the surface 108 of the scale element 102, and a pattern 112 of slider and coupling electrodes (shown in FIG. 6) is formed on the slider 106. Sine signal generator 114, cosine signal generator 116, and detector 118 are connected to the pattern 112 slider and coupling electrodes on the slider surface by their respective signal lines 120, 122 and 124 passing through the fixture 104 and slider element 100 to contact terminal points on those electrodes. No electrical connection is made to the pattern of scale electrodes 110.

One pattern of scale (or "first") electrodes 110 suitable for use in the linear embodiment is shown in FIG. 5a. A first set 126 of isolated scale electrodes is arrayed in a uniformly linearly spaced pattern along the longitudinal axis of the scale element 102. Each scale electrode in the set has a base portion 128 and a finger portion 130 extending from the base portion 128 in a direction transverse to the longitudinal axis of the scale (i.e., transverse to the path of relative motion of the scale and slider elements 100, 102). A second set 132 of uniformly spaced isolated scale electrodes is also shown in FIG. 5a, each electrode having a base portion 134 and a finger portion 136. In the illustrated embodiment, the finger portion of each set 126, 132 of scale electrodes are uniformly spaced on 0.01 in. (0.254 mm.) centers and have a width of 0.0034 in. (0.0864 mm.). The finger portions 136 of the second set 132 of scale electrodes are interleaved at halfcycle spacing with the finger portions 130 of the first set 126 of scale electrodes so that a spacing of 0.0016 in. (0.047 mm.) exists between adjacent interleaved finger portions 130, 136. The base portions 128, 134 of each set of electrodes are separated by a 0.0005 in. (0.0127 mm.) gap and have a width along the longitudinal axis of the scale of 0.0095 in. (0.241 mm.). The remaining dimensions indicated in FIG. 5(a) are listed in TABLE IV.

TABLE IV

| Dimension | Length |
|---|---|
| a | .050 in. (1.27 mm.) |
| b | .065 in. (1.65 mm.) |
| c | .485 in. (12.32 mm.) |
| d | .500 in. (12.70 mm.) |
| e | .550 in. (13.97 mm.) |

Any suitable number of scale electrodes can be arrayed along the length of the scale member 102, but typically such scale electrode patterns are produced in standardized segments, each ten inches (254 mm.) long. Additional scale segments can be added to extend the effective scale length of a transducer, as will be described hereinafter.

An alternative pattern 110' of scale electrodes also suitable for use in the first linear embodiment of this invention is depicted in FIG. 5b. Pattern 110' is identical to the previously described pattern 110 except that the base portions 128 and 134 of the two sets of scale electrodes are respectively connected to form two continuous rectangular areas 138, 140.

FIG. 6 shows a pattern 112 of slider and coupling electrodes deposited on the slider surface 106. Two coupling electrodes 142 and 144 in the form of strips are positioned to be in spaced opposition to the base portions 128 and 134 of the scale electrodes. The areas of the two coupling electrodes 142, 144 are equal, and each coupling electrode 142, 144 has a terminal point 146 and 147, respectively, at which an external circuit can be connected. In FIG. 6 voltage detector 118 is shown connected to terminals 146, 147.

Four groups of slider (or "second") electrodes 148, 150, 160, 162 are also arrayed on slider surface 106. A first phase of slider electrodes comprises two spaced groups of electrodes 148 and 150, each group comprising a set of 25 fingers $152_{A-B}$, each finger having a width of 0.0034 in. (0.0864 mm.) the fingers 152 being uniformly spaced on 0.01 in. (0.254 mm.) centers (one measurement cycle) and interleaved with a similar set of 25 fingers $154_{A-B}$. The fingers $152_{A-B}$ and $154_{A-B}$ of each set are electrically interconnected by conductive strips $156_{A-D}$ which are provided with terminals $158_{A-D}$ for connection to external circuitry as described hereinafter. A second phase of slider electrodes comprises two spaced groups of electrodes 160 and 162. Each of these groups, like the previously described groups 148 and 150 is composed of a set of 25 fingers $164_{A-B}$ which are 0.0034 in. (0.0864 mm.) wide spaced one measurement cycle (0.01 in. or 0.254 mm.) apart and interleaved with another set of 25 similarly dimensioned fingers $166_{A-B}$. The fingers $164_{A-B}$, $166_{A-B}$ of the second phase of slider electrodes are arrayed in space quadrature relative to the respective positions of the fingers $152_{A-B}$, $154_{A-B}$ of the first slider electrodes, i.e. they are each shifted by one-quarter of a measurement cycle (or 0.0025 in. (0.0635 mm.)). Each set of fingers $164_{A-B}$ and $166_{A-B}$ are electrically interconnected by conductive strips $168_{A-D}$, each respectively having an electrical terminal $170_{A-D}$ for connection to external circuitry. TABLE V lists the dimensions noted in FIG. 3.

TABLE V

| Dimension | Length |
|---|---|
| a | .040 in. (1.016 mm.) |
| b | .070 in. (1.778 mm.) |
| c | .075 in. (1.905 mm.) |
| d | .380 in. (9.65 mm.) |
| e | .500 in. (12.70 mm.) |
| f | .540 in. (13.72 mm.) |
| g | .0075 in. (.190 mm.) |

It will be noted by referring to the broken line portions of FIG. 5a that the coupling electrodes 142, 144 so illustrated are arranged to be in opposition to the base portions 128, 134 of the scale electrodes, and their dimensions transverse to the path of relative motion between the scale and slider are less than the corresponding dimensions of the base portions 128, 134. Similarly, the slider electrode groups 148, 150, 160 and 162 oppose the finger portions of the scale electrodes, and the length spanned by the slider electrode fingers is less than the length spanned by the scale electrode fingers.

The arrangement of external circuitry connected to the first linear embodiment shown in FIG. 4 is similar to that described in connection with the rotary embodiment of FIG. 1. A sine signal generator 114 having a signal amplitude proportional to the sine of a given command angle $\theta$ is connected across the slider electrodes of electrode groups 148 and 150. As shown in the figure, one output of the generator 114 is connected to a terminal $158_A$ on an "upper" strip $156_A$ and to a terminal $158_D$ on a "lower" strip $156_D$. The other output from generator 114 is connected to the remaining two terminal points $158_B$ and $158_C$ electrode groups 148 and 150. A cosine signal generator 116 whose output amplitude is adjusted to be proportional to the cosine of the given command angle $\theta$ is connected to the second phase slider electrode groups 160 and 162 in a similarly balanced fashion, one output of the generator going to an upper terminal $170_A$ and to a lower terminal $170_D$, the other output going to the remaining terminals $170_B$, $170_C$. A signal detector 118 is connected to the terminals 146, 147 of the coupling electrodes 142 and 144. As the generators 114 and 116 excite the slider electrode groups 148, 150, 160, 162 to induce a voltage in the scale electrodes 110, that induced voltage is coupled back to the coupling electrodes 142, 144 to be detected by the detector 118. Each measurement cycle corresponds to a command angle of 360°, and the detector 118 senses a null voltage whenever the relative linear displacement of the scale 110 and slider 112 is equal to the given command angle $\theta$ within a measurement cycle. The amplitude of the voltage appearing across the coupling electrodes 142, 144 is a function of the linear displacement of the scale and slider within a measurement cycle of 0.01 in. (0.254 mm.).

Like the circuitry used with the rotary embodiment, the circuitry associated with the first linear embodiment can also be varied so that a constant amplitude signal generator excites the coupling electrodes 142, 144, and two voltage detectors attached to the slider electrodes respectively sense the sine and cosine voltages corresponding to the relative displacement angle $\theta$ between the scale 110 and slider 112 within a measurement cycle. Alternatively, two constant amplitude signal generators of the same frequency but 90° out of time phase with each other can be connected to the first and second phase slider electrode groups 148, 150, 160 and 162, respectively, and a phase detector connected to the coupling electrodes 142, 144 will sense the phase difference of the voltage across the coupling electrodes relative to one of the generators to indicate the relative displacement angle $\theta$.

Either of the scale patterns shown in FIGS. 5a and 5b can be used in the first linear embodiment of the invention, however the isolated scale electrode pattern 110 shown in FIG. 5a provides a particular advantage in practice. With linar position measuring devices it is common to produce scale elements in standardized dimensions which may be added together as units to meet the requirements of specific measurement applications. Thus, scale elements may be produced in standardized ten inch (254 mm.) sections and slider elements in standardized form such as shown in FIG. 6 with an approximate length of 1.5 inches (38 mm.) For certain applications the use of such a slider element with only one scale element section may be satisfactory, but for other applications such as the measurement and control of a machine tool part having a potential movement greater than the standardized scale section length, two or more scale elements must be combined with precision spacing and alignment. When the continuous base portion scale electrode pattern 110' of FIG. 5b is used, the impedance relationship between the slider and coupling electrodes and the scale electrodes will vary as a function of the number of scale element sections used in the device. This variation in impedance requires corresponding adjustment of parameters in the external circuitry used with the device in order to obtain the maximum gain and optimum performance from the device. However, when the pattern 110 of isolated scale electrodes of FIG. 5a is employed there is no significant change in the impedance relationship between the slider and scale elements when additional scale sections are combined in opposition to the slider element, and the design of the associated external circuitry need not be altered accordingly and may have a standardized electronic design. Also, any noise induced in the scale electrodes which are not opposed to the slider electrodes is not transmitted to the slider electrodes.

As with the previously described rotary embodiment, undesired components may be reduced in the electrostatic coupling wave between the scale and slider electrodes in the first linear embodiment by dimensioning the electrodes appropriately. In the illustrated embodiment the scale electrode fingers 130, 136 and slider electrode fingers $152_{A-B}$, $154_{A-B}$, $164_{A-B}$, $166_{A-B}$ have a width of 0.0034 in. (.086 mm.) which is one third of the measurement cycle of the device, so that the third harmonic of the fundamental coupling frequency is reduced. If the fifth harmonic were to be reduced an electrode width of 0.002 in. (0.051 mm.), or one-fifth of the measurement cycle would be chosen. Dimensioning the width/cycle relation for either the scale or slider electrodes can suppress unwanted harmonic components in the electrostatic coupling wave, and different width relationships can be used with scale and slider electronics to reduce different order harmonic components.

Harmonic components in the coupling wave can also be reduced by means of the technique described in connection with the rotary embodiment, namely expanding or contracting the linear extent of the slider ("second") electrode groups by an amount equal to the measurement cycle divided by N, where N is the order of the unwanted harmonic. In the illustrated linear embodiment each of the slider electrode groups 148, 150, 160 and 162 extends a distance of 0.25 in. To suppress a fifth harmonic in the coupling wave the extent of each group can be either expanded or compressed by one-fifth of a measurement cycle (0.002 in.) to occupy 0.252 in. or 0.248 in., respectively.

Undesired capacitive coupling between the slider electrodes and coupling electrodes is substantially reduced in the illustrated first linear embodiment by dividing each space phase of slider electrodes into groups (i.e., groups 148 and 150 for the first space phase, and groups 160 and 162 for the second space phase), and alternating these groups in position along the path of relative movement between the scale and slider elements as shown in FIG. 6. With this arrangement, one terminal of a sine signal generator 114 (e.g., the terminal having instantaneously a maximum positive potential) can be connected to one first space phase slider electrode group 148 at a point adjacemnt to the coupling electrode 42 and also to another first space phase slider electrode group 150 at a point adjacent to the other coupling electrode 144; the other terminal of sine generator 114 (having instantaneously a maximum negative potential) is connected to the remaining terminals of slider electrode groups 148 and 150; and the effects of the sine signal excitation upon the coupling electrodes 142, 144 is completely balanced and therefore effectively eliminated in the electrical operation of the device. The cosine signal generator 116 is connected to the second space phase slider electrode groups in a completely analogous fashion so that its capacitive coupling with the two coupling electrodes 142, 144 is also balanced out and effectively eliminated.

It will also be noted that the combined areas of the base portions 128, 134 of each set of scale electrodes are equal, and that the areas of the two coupling electrodes 142, 144 are equal to maintain overall capacitive balance. The widths of the coupling electrodes 142, 144 are slightly less than the widths of the opposed centrally aligned scale base portions 128, 134, and the span of the slider electrode fingers is less than that of the centrally aligned scale electrode fingers so that the coupling electrodes do not interact with the scale electrode fingers, and the slider electrodes do not couple with the scale electrode base portions. This dimensioning also tends to compensate for any minor deviation of the center line of the slider element 112 from the longitudinal axis of the scale element 110 in their relative motion.

Second Linear Embodiment

Figure 7:
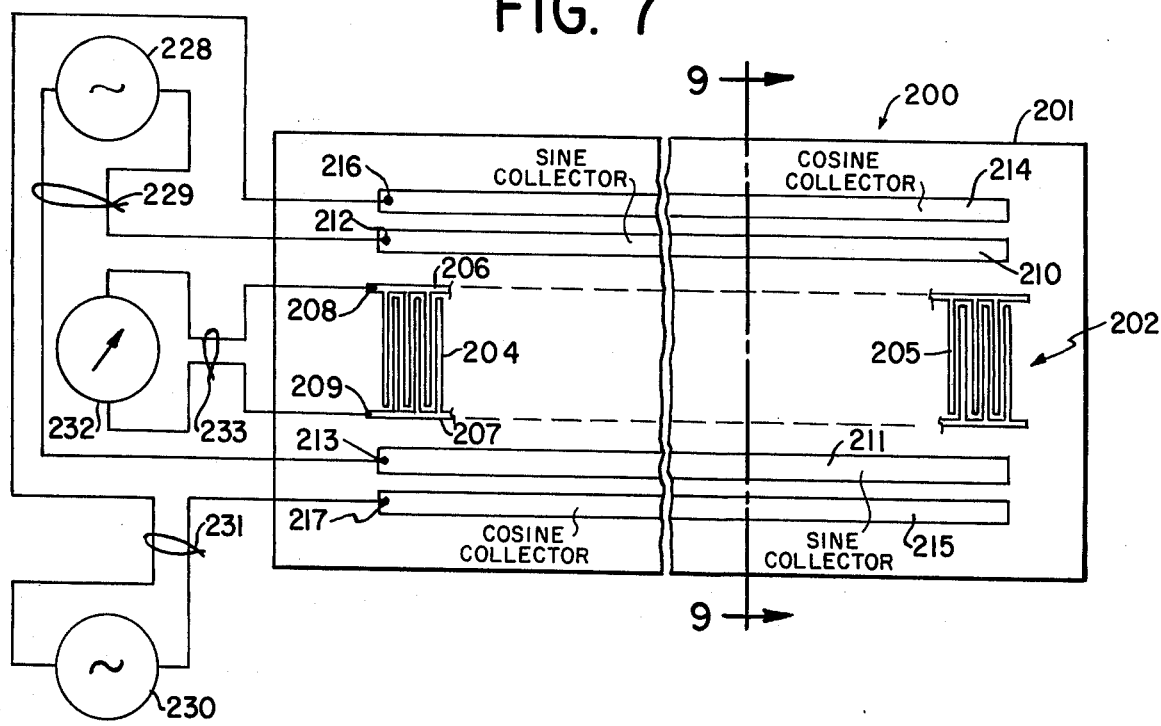
FIG. 7 is a front elevational view of the scale element of a second linear embodiment of the present invention and related circuitry.
Figure 8:
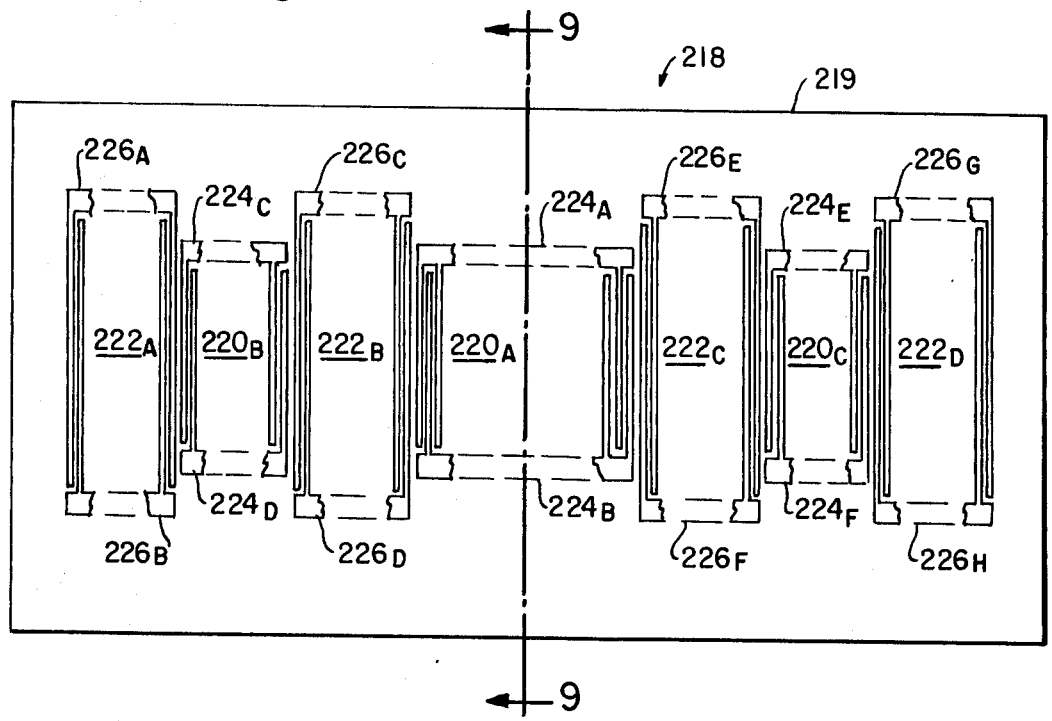
FIG. 8 is a front elevational view of the slider element of said second linear embodiment.
Figure 9:
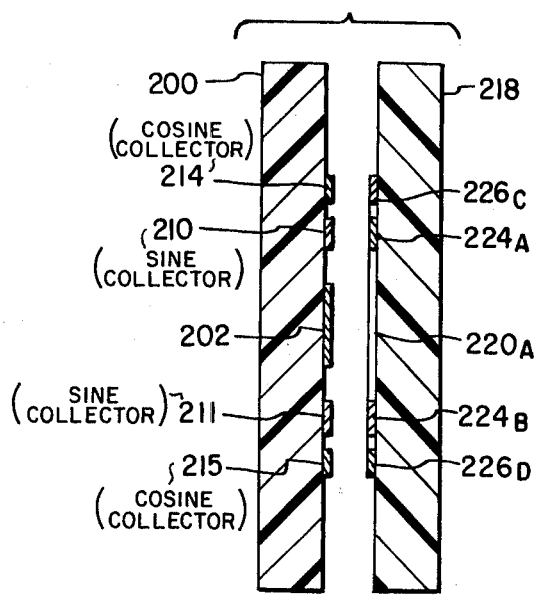
FIG. 9 is a composite sectional view of the scale and slider elements of said second linear embodiment taken along lines 9-9 of FIGS. 7 and 8, respectively.

A second linear embodiment having a 0.01 inch (0.254 mm.) measurement cycle is shown in FIGS. 7–9. FIG. 7 depicts a portion of a scale element 200 of the embodiment, the electrode pattern thereon and related circuitry connected to those electrodes. Specifically, the scale element 200 has a base 201 formed of nonmagnetic metal such as aluminum of any suitable length and thickness, which can be rigidly fixed to a support (not shown). Interdigitated scale electrodes 202 are insulatingly mounted along the length of the scale element base 201. The scale electrodes 202 are 0.0005 in. (0.0127 mm.) thick and are insulated from the aluminum scale element 200 by a thin layer of insulating adhesive (not shown). Each of the interdigitated scale electrodes 202 comprises a finger 204, 205 having a width of 0.0034 in. (0.0864 mm.) and a length of 0.394 in. (10.0 mm.). The scale electrodes 202 are uniformly spaced on 0.005 in. (0.127 mm.) centers, which is one-half the measurement cycle of the transducer.

Alternating scale electrodes 202 are interconnected by two conductive strips 206, 207 which are provided with respective electrical terminals 208, 209 for connection to external circuitry, as described hereinafter.

Two sine collector electrodes 210, 211 are arrayed along the length of the scale element 200, each having a respective electrical terminal 212, 213. Running parallel to the sine collector electrodes 210, 211 are two cosine collector electrodes 214, 215, which also are provided with terminals 216, 217.

FIG. 8 shows a slider element 218 having an aluminum base 219 adapted to be placed in spaced opposition to the scale element 200 of the second linear embodiment as illustrated in FIG. 9 and arranged for relative linear motion along the length of the scale element 200. The slider base 219 has two phases of 0.0005 in. (0.0127 mm.) thick copper electrodes insulatingly arrayed on its surface in opposition to the scale element 200. One phase of the slider electrodes comprises the three sine electrode groups $220_{A-C}$. A second phase of slider electrodes comprises the four cosine electrode groups $222_{A-D}$. Sine electrode group 220A is centrally located on the slider element 218 and has 64 interleaved fingers, each 0.0034 in. (0.0864 mm.) wide, uniformly spaced one from another on 0.005 in. (0.127 mm.) centers. Sine electrode groups $220_B$ and $220_C$ each have 32 interleaved fingers of similar dimension and spacing in space phase with group $220_A$. Alternating fingers in each sine electrode group $220_{A-C}$ are interconnected by sine conductor base bars $224_{A-F}$ which are positioned to be opposite and capacitively coupled to the sine collector bars 210, 211 as shown in FIG. 9.

The cosine electrode groups $222_{A-D}$ each have 32 interleaved fingers of the same width and spacing as the fingers of the sine electrode groups $220_{A-C}$. The fingers of the cosine electrode groups $222_{A-D}$ are positioned, however, to be in space quadrature relative to the position of the fingers of the sine electrode groups $220_{A-C}$, i.e., uniformly spaced one-quarter of a measurement cycle out of phase with the position of the fingers of the sine electrode groups $220_{A-C}$. Alternating fingers in each cosine electrode group $222_{A-D}$ are interconnected by cosine conductor base bars $226_{A-H}$ which are positioned to be opposite and capacitively coupled to the cosine collector bars 214 and 215, as shown in FIG. 9. Therefore when the scale element 200 and slider 218 are arranged for relative movement in spaced opposition, separated by an air gap, typically 0.003 in. (0.076 mm.) wide, the sine conductor base bars $224_{A-F}$ are capacitively coupled to the sine collection bars 210, 211; the cosine conductor base bars $226_{A-H}$ are capacitively coupled to the cosine conductor bars 214, 215; and the sine and cosine electrode groups $220_{A-C}$ and $222_{A-D}$ are capacitively coupled to the scale electrodes 202.

The external circuitry shown in FIG. 7 connected to the electrodes on the scale element 200 is similar to the circuitry connected to the slider element 100 of the first linear embodiment of FIG. 4. A sine generator 228 having a signal amplitude proportional to the sine of a given command angle $\theta$ within a measurement cycle is connected by lines 229 to the terminals 212, 213 of the sine collector bars 210, 211. A cosine generator 230, having a signal amplitude proportional to the cosine of the command angle $\theta$ is connected by lines 231 to the terminals 216, 217 of the cosine collector bars 214, 215. A voltage detector 232 is connected by lines 233 to the terminals 208, 209 of the scale electrode conductor strips 206, 207. The alternating voltage generator 228, is coupled by means of the sine collector bars 210, 211 to the opposed sine conductor bars $224_{A-F}$ and to the sine electrode groups $220_{A-C}$. The voltage generated by the cosine generator 230 is similarly coupled to the cosine electrode groups $222_{A-D}$ by means of the capacitively coupled cosine collector bars 214, 215 and cosine conductor bars $226_{A-H}$. These sine and cosine signals are then electrostatically coupled back to the interleaved scale electrodes 202, and a resultant "error signal" voltage is sensed by the detector 232 connected across the scale electrode conductor strips 206, 207. The voltage sensed by the detector 232 reaches a null when the scale element 200 and the slider element 218 have a relative displacement within a measurement cycle equal to the given command angle $\theta$. Otherwise the detected error signal is a function of the difference between the relative displacement of the scale element 200 and slider element 218 within a measurement cycle and the command angle $\theta$.

In the same manner as described in connection with the rotary and first linear embodiments, the circuitry can be varied so that a constant amplitude signal generator excites the scale electrodes 202 and two voltage detectors respectively sense the sine and cosine voltages derived across the sine and cosine collector bars 210, 211, 214, and 215, those voltages being trigonometrically related to displacement angle $\theta$ between the scale element 200 and slider element 218 within a measurement cycle. Alternatively, two constant amplitude signal generators of the same frequency but 90° out of phase with each other can be connected to the sine and cosine collector bars 210, 211 and 214, 215, respectively, and a phase detector connected across the scale electrode conductor strips 206, 207 will sense the phase of the signal appearing across the scale electrodes 202 relative to one of the generators to indicate the relative displacement angle $\theta$.

The width and spacing of the fingers of the scale electrodes 202 and the sine and cosine electrode groups $220_{A-C}$, $222_{A-D}$ are designed, as with the two previously described embodiments to reduce an undesired harmonic component (the third) in the coupling wave between the scale electrodes 202 and sine and cosine electrode groups $220_{A-C}$, $222_{A-D}$.

It will be apparent from a study of FIGS. 7–9 that the sine electrode groups $222_{A-D}$ on the slider 218 span a greater distance transverse to the length of the slider 218 than do the cosine electrode groups $220_{A-C}$. It will also be noted that the interleaved fingers of the sine electrode groups $222_{A-D}$ are in opposition, and hence, capacitively coupled to the cosine collector bars 210, 211 on the scale member 200. This coupling, however, introduces no undesired effect, however, since both sets of interleaved fingers in each sine electrode group $222_{A-D}$ cross each cosine collector bar 210, 211, the sets of fingers tending to induce equal and opposite capacitive coupling with the collector bars 210, 211, cancelling each other out to produce zero capacitive coupling.

Three specific embodiments of the present invention have been described, but it will be obvious to those skilled in the art that other embodiments of the invention can be envisioned. For example, the first electrodes can be arrayed on a cylindrical surface of one element and the second and coupling electrodes can be arrayed on a correspondingly concave surface of the other element. In any of its embodiments, the present invention provides a high gain, electrostatic position measurement device having a potentially attainable precision significantly greater than comparable inductive-type devices. The invention requires that electrical connections be made only to one of its two relatively movable elements, and it incorporates novel features for the reduction or elimination of unwanted impedance variations, undesired capacitive coupling and unwanted harmonic coupling wave frequency components.

What is claimed is:

1. A transducer having a plurality of measurement cycles comprising:
   a. two relatively movable elements, each said element having a surface positiond in spaced opposition to a surface of the other element;
   b. two sets of first electrodes fixed on the surface of one of said elements, each first electrode having a base portion and a finger portion extending from said base portion in a direction transverse to the path of relative movement of said elements, the finger portions of each set of first electrodes being uniformly spaced one measurement cycle apart, and the finger portions of one set of first electrodes being interdigitated at one-half cycle spacing with the finger portions of the other set of first electrodes;

c. two sets of second electrodes fixed on the surface of the other said elements, each set of second electrodes having finger portions extending in a direction transverse to said path and spaced approximately one cycle apart opposing the finger portions of said sets of first electrodes, the finger portions of one set of second electrodes being uniformly interdigitated with the finger portions of the other set of second electrodes;

d. first and second coupling electrodes fixed on the surface of said other of said elements, said coupling electrodes respectively opposing and capacitively coupling with the base portions of said two sets of first electrodes;

e. means for electrically interconnecting each set of second electrodes, respectively, and for connecting said sets of second electrodes in an external circuit; and f. means for connecting said first and second coupling electrodes in an external circuit.

2. A transducer according to claim 1 wherein the base portions of each set of first electrodes are electrically connected to each other and form a continuous area.

3. A transducer according to claim 1 wherein each electrode of said sets of first electrodes is electrically insulated from one another.

4. A transducer according to claim 1 wherein the combined area of the base portions of one set of first electrodes equals the combined area of the base portions of the other set of first electrodes.

5. A transducer according to claim 1 wherein the area of the first coupling electrode equals the area of the second coupling electrode.

6. A transducer according to claim 1 wherein the respective dimensions of the base portions of the two sets of first electrodes extending in a direction transverse to said path away from the finger portions of said sets of first electrodes is greater than the respective corresponding dimensions of the opposed coupling electrodes, and the areas of the first and second coupling electrodes are equal.

7. A transducer according to claim 1 wherein the dimension transverse to the path of relative movement of the elements spanned by the finger portions of the first electrodes is greater than the corresponding dimension spanned by the opposed finger portions of the second electrodes.

8. A transducer according to claim 1 wherein the width of each of the finger portions of the first electrodes parallel to the path of relative movement of the elements equals the measurement cycle divided by N, where N is the order of an undesired harmonic component of a fundamental frequency signal applied to the transducer by said external circuitry, whereby said undesired harmonic component is reduced in the coupling wave between said first and second electrodes.

9. A transducer according to claim 1 wherein the width of each of the finger portions of the second electrodes parallel to the path of relative movement of the elements equals the measurement cycle divided by N, where N is the order of an undesired harmonic component of a fundamental frequency signal applied to the transducer by said external circuitry, whereby said undesired component is reduced in the coupling wave between said first and second electrodes.

10. A transducer according to claim 1 wherein the elements are relatively rotatable in a circular path about a common axis.

11. A transducer according to claim 1 wherein the elements are relatively movable along a linear path.

12. A transducer according to claim 1 further comprising:

two additional sets of second electrodes fixed on the surface of said other element, the second electrodes in said additional sets having finger portions extending transversely to said path and spaced one cycle apart opposing the finger portions of said first electrodes, the finger portions of one additional set of second electrodes being interdigitated at one-half cycle spacing with the finger portions of the other additional set of second electrodes, and the finger portions of the additional sets of secondary electrodes being arrayed in space quadrature relative to the finger portions of said two sets of second electrodes, respectively; and means for interconnecting each additional set of second electrodes, respectively, and for connecting said additional sets of second elecrodes in an external electrical circuit.

13. A transducer according to claim 12 wherein said two sets of interdigitated second electrodes are arrayed in a plurality of spaced first phase groups, and the two additional sets of interdigitated second electrodes are arrayed in a plurality of spaced second phase groups, the first phase groups and second phase groups alternating in position along said path on the surface of the other element.

14. A transducer according to claim 1 further comprising:

two additional sets of first electrodes fixed on the surface of said one element, the first electrodes in said additional sets having base portions and finger portions extending from said base portions transversely to said path spaced one cycle apart opposing the finger portions of said second electrodes, the finger portions of one additional set of first electrodes being interdigitated at one-half cycle spacing with the finger portions of the other additional set of first electrodes, the finger portions of the additional sets of first electrodes being arrayed in space quadrature relative to the finger portions of said two sets of first electrodes, respectively.

15. A transducer according to claim 14 wherein the two sets of interdigitated first electrodes are arrayed in a plurality of spaced first space phase groups, and the additional sets of interdigitated first electrodes are arrayed in a plurality of spaced second space phase groups, said first space phase groups being positioned alternately with said second space phase groups along said path in the surface of said one element.

16. A transducer according to claim 14 further comprising third and fourth coupling electrodes fixed on the surface of said other of said elements, said third and forth coupling electrodes respectively opposing and capacitively coupling with the base portions of said two additional sets of first electrodes; and means for connecting said third and fourth coupling electrodes in an external circuit.

17. A transducer according to claim 16 wherein the finger portions of said two additional sets of first electrodes are opposed to and capacitively coupled with the first and second coupling electrodes, said additional sets of first electrodes inducing equal and opposite charges in each of said first and second coupling electrodes whereby the capacitive coupling between said additional sets of first electrodes and said first and second coupling electrodes is effectively minimized.

* * * * *